US008526263B2

(12) United States Patent  (10) Patent No.: US 8,526,263 B2
Park et al.  (45) Date of Patent: *Sep. 3, 2013

(54) MULTI-LAYERED MEMORY DEVICES

(75) Inventors: Jaechul Park, Seoul (KR); Keewon Kwon, Seongnam-si (KR); Youngsoo Park, Yongin-si (KR); Seunghoon Lee, Seoul (KR); Seungeon Ahn, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 63 days.

This patent is subject to a terminal disclaimer.

(21) Appl. No.: 12/929,355

(22) Filed: Jan. 19, 2011

(65) Prior Publication Data

US 2011/0116297 A1 May 19, 2011

Related U.S. Application Data

(62) Division of application No. 12/232,146, filed on Sep. 11, 2008, now Pat. No. 7,898,893.

(30) Foreign Application Priority Data

Sep. 12, 2007 (KR) .................. 10-2007-0092651
May 21, 2008 (KR) .................. 10-2008-0047092

(51) Int. Cl.
*G11C 8/00* (2006.01)
(52) U.S. Cl.
USPC ...... 365/230.03; 365/51; 365/63; 365/230.06
(58) Field of Classification Search
USPC ............... 365/51, 63, 230.03, 230.06
See application file for complete search history.

(56) References Cited

U.S. PATENT DOCUMENTS

| 5,687,108 | A | 11/1997 | Proebsting |
| 5,991,224 | A | 11/1999 | Aipperspach et al. |
| 6,185,122 | B1 | 2/2001 | Johnson et al. |
| 6,594,169 | B2 | 7/2003 | Sakui |
| 2006/0164882 | A1 | 7/2006 | Norman |
| 2006/0262587 | A1 | 11/2006 | Matsui et al. |
| 2007/0153620 | A1 | 7/2007 | Kang |
| 2007/0253245 | A1* | 11/2007 | Ranjan et al. ............. 365/171 |
| 2008/0043559 | A1 | 2/2008 | Norman |
| 2008/0198646 | A1 | 8/2008 | Park et al. |
| 2009/0063757 | A1 | 3/2009 | Norman |

FOREIGN PATENT DOCUMENTS

| JP | 1991-072664 | 3/1991 |
| KR | 10-2001-0088672 | 9/2001 |
| KR | 10-2003-0036028 | 5/2003 |
| KR | 10-2006-0088907 A | 8/2006 |

OTHER PUBLICATIONS

Korean Office Action dated May 22, 2009 and English translation thereof.
European Search Report dated Sep. 29, 2009.

* cited by examiner

*Primary Examiner* — Hoai V Ho
(74) *Attorney, Agent, or Firm* — Harness, Dickey & Pierce, P.L.C.

(57) ABSTRACT

A multi-layered memory device is provided. The multi-layered memory device includes two or more memory units and an active circuit unit arranged between each of the two or more memory units. The active circuit includes a decoder. Each memory unit includes one or more memory layers. Each memory layer includes a memory array.

19 Claims, 15 Drawing Sheets

MULTI-LAYERED MEMORY DEVICES

PRIORITY STATEMENT

This application is a divisional claiming the benefit under 35 U.S.C. §121 of U.S. application Ser. No. 12/232,146, filed on Sep. 11, 2008 now U.S. Pat. No. 7,898,893, and claims priority under 35 U.S.C. §119 to Korean Patent Application Nos. 10-2007-0092651, filed on Sep. 12, 2007, and 10-2008-0047092, filed on May 21, 2008 in the Korean Intellectual Property Office (KIPO), the entire contents of each of which are incorporated herein by reference.

BACKGROUND

Description of the Related Art

In line with the developments of multimedia technologies, demand for larger-capacity information storage devices for use in computers, communication devices, or the like are increasing. In order to satisfy this increasing demand, information devices having relatively high information storage density and relatively high operating speeds have been developed.

Conventionally, memory devices include an active circuit unit and a memory unit. The active circuit unit includes an address decoder, a reading/recording logic controller, a sense amplifier, an output buffer, a multiplexer, and other components to read and record data. These components are generally referred to as 'overhead', and occupy a portion of a physical memory area. If the area occupied by the overhead is relatively small, a larger area is usable as a memory area. In order to increase density of the memory devices, a research with the aim of forming a multi-layered memory device has been conducted.

SUMMARY

Example embodiments relate to multi-layered memory devices, for example, multi-layered memory devices having a multi-layer structure including one or more memory layers arranged on at least one surface of an active circuit unit.

Example embodiments provide a more highly integrated multi-layered memory device, which may increase data storage density.

At least one example embodiment provides a multi-layered memory device. According to at least this example embodiment, the multi-layered memory device may include two or more memory units and an active circuit unit. The active circuit unit may include a decoder, and be formed between each of the two or more memory units.

At least one other example embodiment provides a multi-layered memory device. The multi-layered memory device may include a plurality of memory groups stacked on one another. The memory groups may include a memory unit and an active circuit configured to control the memory unit.

According to example embodiments, the memory unit may include one or more memory layers. The one or more memory layers may be cross-point type memory arrays. The cross-point type memory array may have a structure in which adjacent memory array layers share an electrode. A plurality of sub-arrays may be formed on the one or more memory layers. The active circuit unit may be formed on a non-silicon substrate. The non-silicon substrate may be one of a plastic substrate, a glass substrate, a ceramic substrate, an oxide substrate, and a nitride substrate. Each active circuit unit and corresponding memory unit may be grouped into a memory group. A plurality of the memory groups may be stacked on one another. Each active circuit unit may include at least one of a column decoder (CD) and a row decoder (RD).

According to at least some example embodiments, column address lines extending from the CD may be connected to the memory unit through vias, and row address lines extending from the RD may be connected to the one or more memory layers through vias.

According to at least some example embodiments, an active circuit unit may include a first active circuit and a second active circuit. The first active circuit may include a CD, whereas the second active circuit may include a RD. The memory unit may be connected to each of the first active circuit and the second active circuit. Column address lines extending from the CD of the first active circuit may be connected to the memory unit through vias, and row address lines extending from the RD of the second active circuit may be connected to the one or more memory layers through vias.

According to at least some example embodiments, a logic unit may be formed on a surface of one of the active circuit unit and the memory unit. The multi-layered memory device may further include a memory area formed on a substrate. The memory area may include the memory units and the active circuit unit. An input/output (I/O) chip may be connected by the memory area and a parallel bus line. A serial bus line may connect the I/O chip and a master device.

At least one other example embodiment provides a multi-layered memory device. The multi-layered memory device may include at least one active circuit and at least one memory unit. The at least one active circuit may include a decoder. Each of the at least one memory units may be connected to the decoder. The at least one memory unit may be separate from the at least one active circuit. The at least one active circuit may be arranged above or below the at least one memory unit.

According to at least some example embodiments, the at least one memory unit may include a plurality of memory layers stacked on one another. Each of the plurality of memory layers may be connected to the decoder.

According to at least some example embodiments, the decoder may include a column decoder and a row decoder. The column decoder may include a first column decoder circuit arranged at a first side of the at least one active circuit and a second column decoder circuit arranged at a second side of the at least one first active circuit. The row decoder may include a first row decoder circuit arranged at a third side of the at least one active circuit and a second row decoder circuit arranged at a fourth side of the at least one active circuit. The first and second sides may be opposite to each other, whereas the third and fourth sides may be opposite to each other.

According to at least some example embodiments, the decoder may be connected to each of the at least one memory units via address lines extending upward or downward from the at least one active circuit. The decoder may include a column decoder and a row decoder. The column decoder may be connected to each of the at least one memory unit via column address lines extending vertically upward or downward from the at least one active circuit. The column address lines may be connected to the at least one memory unit through vias arranged at least one side of the first active circuit. The vias may be offset from one another in a direction perpendicular to the direction in which the at least one side extends.

According to at least some example embodiments, the row decoder may be connected to each of the at least one memory unit via row address lines extending vertically upward or downward from the at least one active circuit. The row address lines may be connected to the at least one memory unit through vias arranged at least one side of the first active circuit. The vias may be offset from one another in a direction perpendicular to the direction in which the at least one side extends.

According to at least some example embodiments, the at least one memory unit may include at least one memory layer. The at least one memory layer may include at least one memory array.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1A:
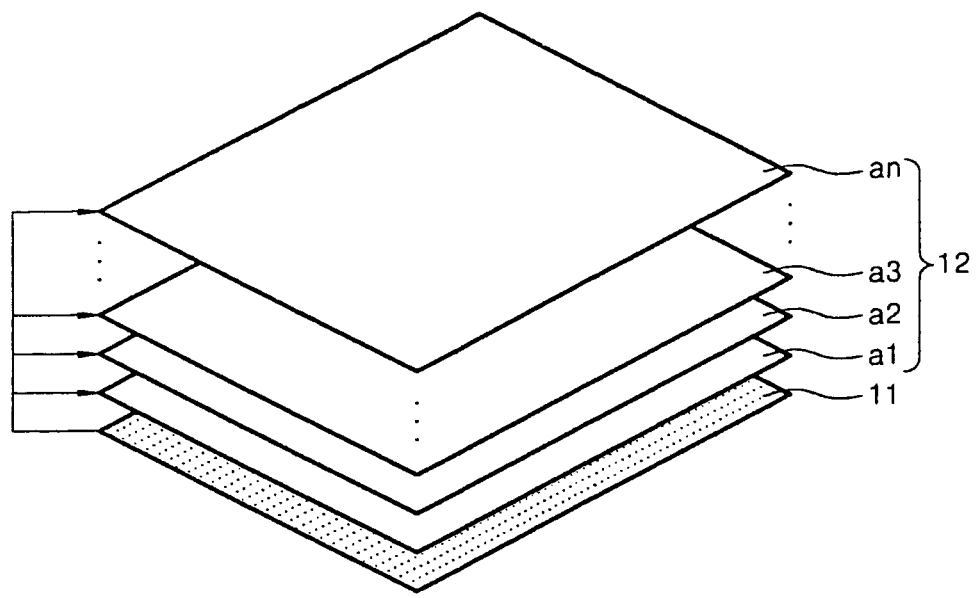
FIG. 1A is a diagram illustrating a multi-layered memory device according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

Further, it will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

Further still, it will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A multi-layered memory device according to the present invention will now be described more fully with reference to the accompanying drawings, in which exemplary embodiments of the invention are shown. In the drawings, the thicknesses and widths of layers are exaggerated for clarity.

Multi-layered memory devices according to example embodiments may have a structure in which a plurality of memory units including one or more memory layers are formed. An active circuit unit may be included between each of the plurality of memory units. The one or more memory layers may be stacked to form each of the plurality of memory units. The active circuit unit may control each of the plurality of memory units. The active circuit unit and each of the plurality of memory units may be grouped into a memory group. The multi-layered memory device may have a structure in which a plurality of the memory groups are stacked on one another. By forming the active circuit unit on a non-silicon substrate, each of the plurality of memory units and the active circuit unit may be sequentially formed by a deposition process, not a bonding process. In a multi-layered memory device according to example embodiments, the active circuit unit may be formed in any desired position of the bottom, middle, or top of the plurality of memory units.

FIG. 1A is a diagram illustrating a multi-layered memory device according to an example embodiment. Referring to FIG. 1A, a memory unit 12 may include a plurality of memory layers a1 through an formed on a surface of an active circuit unit 11. The active circuit unit 11 and the memory unit 12 formed on the surface of the active circuit unit 11 may constitute an example embodiment of a multi-layered memory device. The number of memory layers a1 through an capable of being formed on the active circuit 11 is unlimited. The active circuit unit 11 may include a decoder. The decoder may further include a row decoder (RD) and a column decoder (CD). Each of the plurality of memory layers a1 through an may be formed to have an array structure including a plurality of memory cells.

Figure 1B:
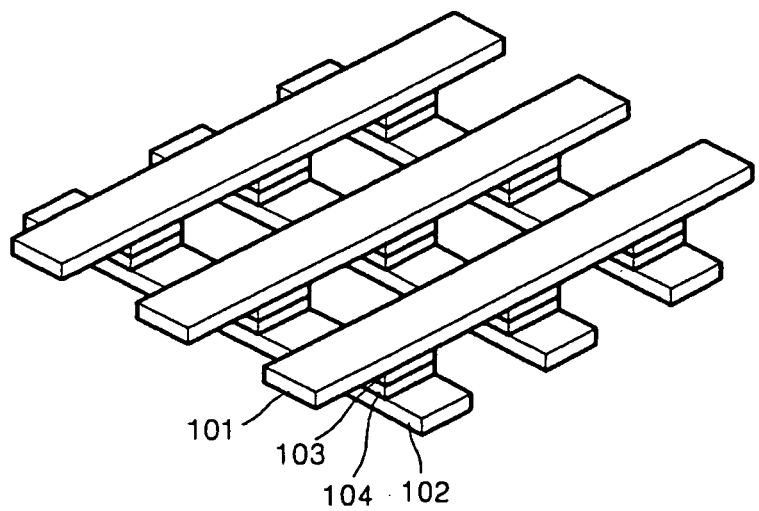
FIGS. 1B through 1D are diagrams illustrating memory layers according to example embodiments.

Referring to FIG. 1B, each of the plurality of memory layers a1 through an may be a cross-point type memory array structure. In the example embodiment shown in FIG. 1B, an information storage unit 103 and a switch structure 104 (e.g., a diode, transistor or the like) may be formed at each cross-point between a plurality of first electrode lines 101 formed in a first direction and a plurality of second electrode lines 102 formed in a second direction. The plurality of first electrode lines 101 and the plurality of second electrode lines 102 may be formed perpendicular or substantially perpendicular to one another. The information storage unit 103 may have a memory structure having various forms. For example, the information storage unit 103 may be formed of a ferroelectric capacitor, a magnetoresistive element, a phase-change element, a variable-resistance element, an antifuse, and the like, which are memory elements in a reversible structure or an irreversible structure. Also, adjacent memory layers from among the plurality of memory layers a1 through an may be formed to share an electrode, and be stacked.

Figure 1C:
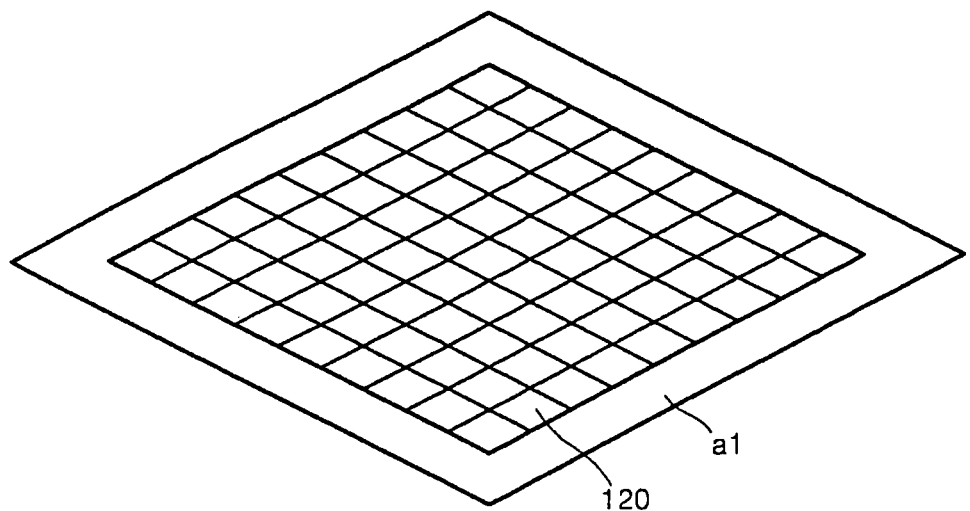
Figure 1D:
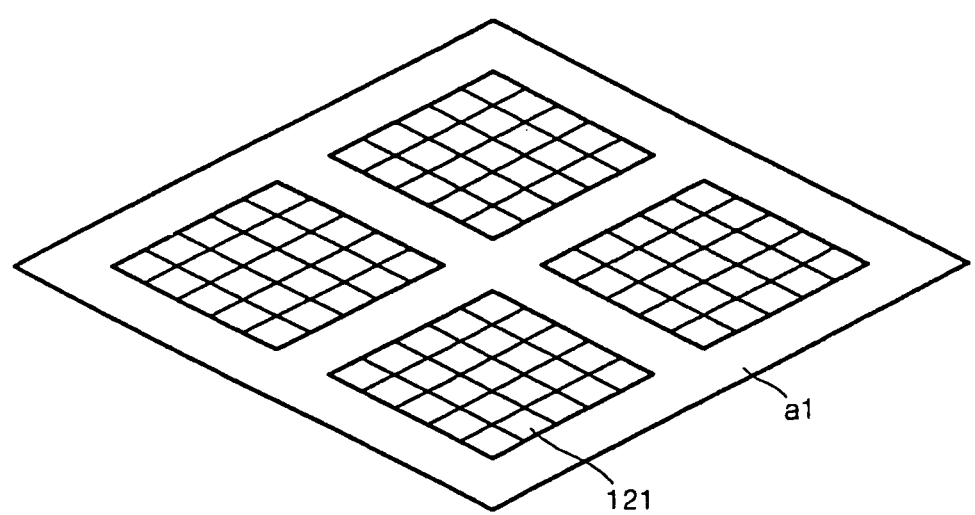

Each of the plurality of memory layers a1 through an may include a memory array. FIG. 1C illustrates an example embodiment of a memory array 120. FIG. 1D illustrates another example embodiment of a memory array including a plurality of sub-arrays 121. Each of the plurality of memory layers a1 through an may include a memory array such as the memory arrays shown in FIGS. 1C and 1D. Each of the example embodiments shown in FIGS. 1C and 1D may be used in conjunction with one another or separate. For example, in an example embodiment, memory layer a1 may be configured as shown in FIG. 1C, whereas memory layer a2 may be configured as shown in FIG. 1D. The memory layers shown in FIGS. 1C and 1D may be stacked alternately to form memory devices according to example embodiments. Alternatively, each of the memory layers a1 through an may be configured as shown in FIG. 1C. In another example, each of the memory layers a1 through an may be configured as shown in FIG. 1D.

Figure 2A:
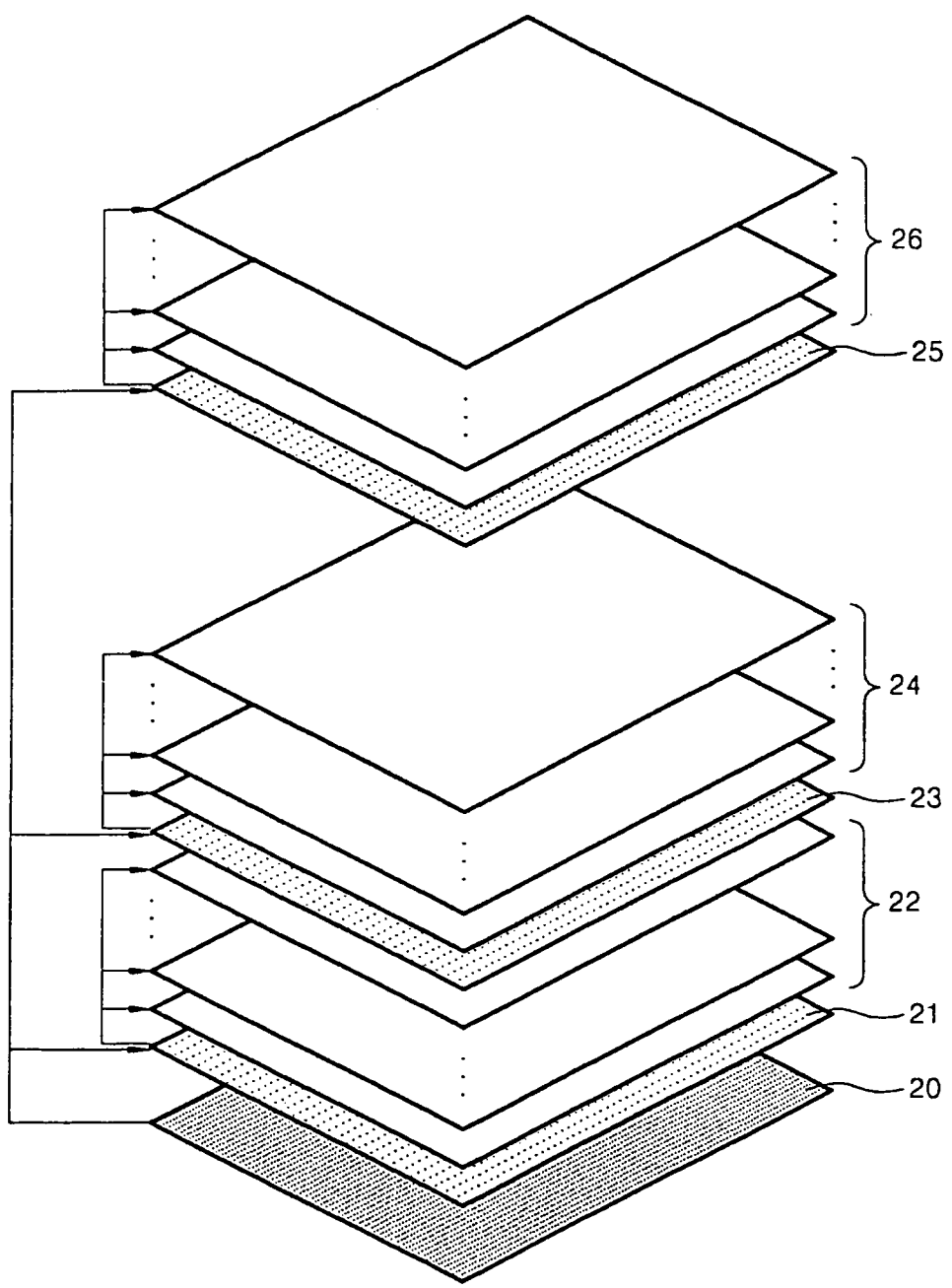
FIGS. 2A and 2B are diagrams illustrating multi-layered memory devices according to example embodiments.
Figure 2B:
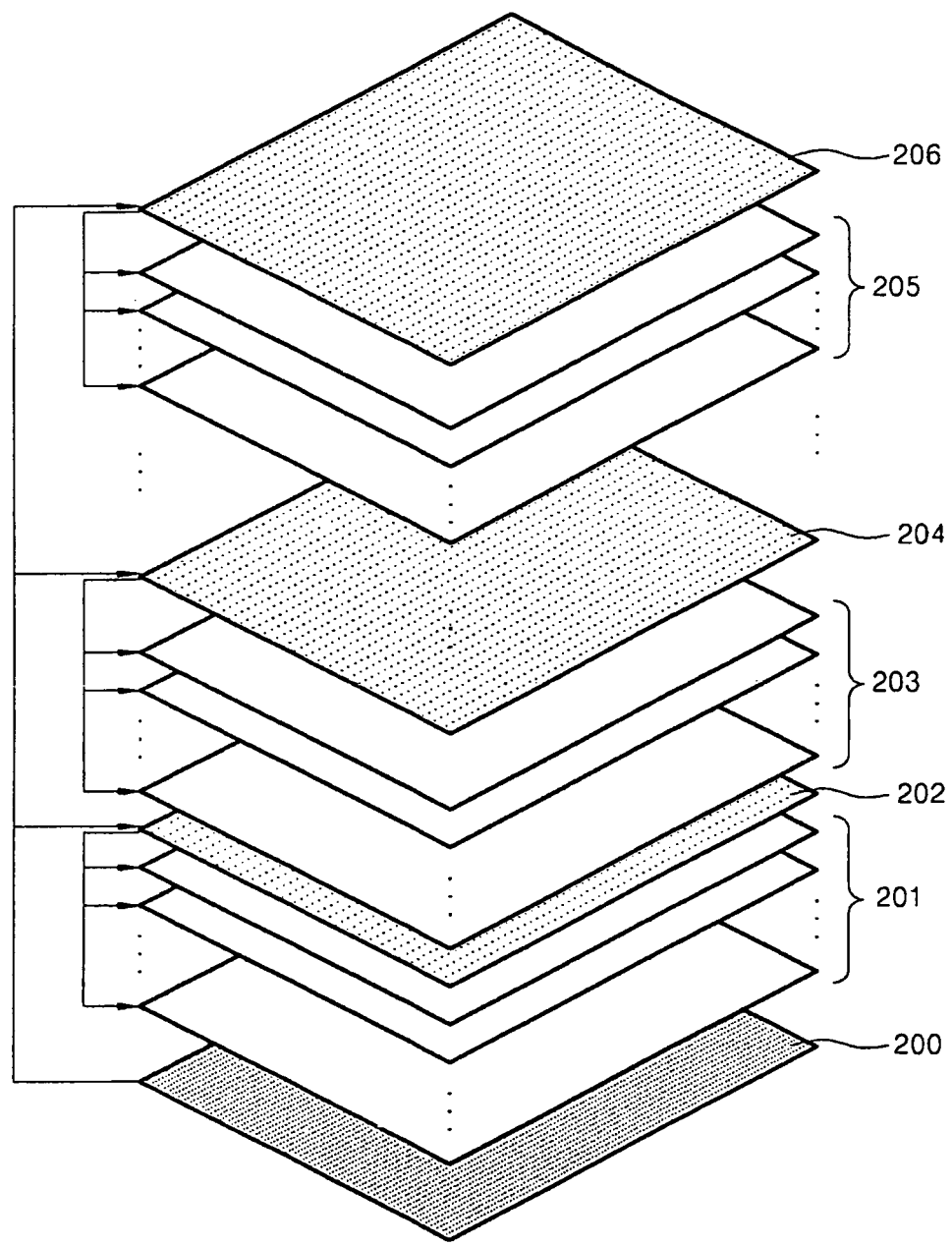

FIGS. 2A and 2B are diagrams illustrating a multi-layered memory device according to another example embodiment. For example, FIGS. 2A and 2B illustrate a structure in which a memory group including an active circuit unit and a memory unit are stacked sequentially.

Referring to FIG. 2A, the memory device may include a plurality of memory groups stacked on one another (e.g., vertically stacked). Each of the plurality of memory groups may include an active circuit and a memory unit. Each memory unit may include one or more memory layers. For example, a first memory group may include a first active circuit unit 21 and a first memory unit 22. The first memory unit 22 may include a plurality of memory layers and may be arranged above (or on) the first active circuit 21. The first memory group may be formed on a logic circuit or unit 20. The logic unit 20 may also serve as an active circuit. A second memory group may include a second active circuit 23 and a memory unit 24 arranged above or on a surface of the second active circuit 23. The second memory group may be stacked on the first memory group. A third memory group may include a third active circuit 25 and a third memory unit 26 arranged above or on a surface of the third active circuit 25. The third memory group may be arranged on the second memory group.

In the structure of FIG. 2A, each of memory units 22, 24, and 26 may be formed on each of active circuit units 21, 23, and 25, respectively. The logic unit 20 may include a logic circuit, and may select one or more of the active circuit units 21, 23, and 25. Each of the active circuit units 21, 23, and 25 may include a decoder, and may select one or more of the memory units 22, 24, and 26. The decoder may include a row decoder (RD) and a column decoder (CD).

Multi-layered memory devices according to at least this example embodiment may include a plurality of the active circuit units 21, 23, and 25 capable of selecting one or more memory units 22, 24, 26 and capable of recording and reproducing information. The multi-layered memory devices may further include the logic unit 20 controlling the active circuit units 21, 23, and 25. Conventional memory devices have a structure in which an active circuit unit is formed on a silicon substrate and a plurality of memory layers are formed on the active circuit unit. However, the active circuit unit is designed to be a single unit such that many via holes are necessary and a complicated line process is required. Unlike the conventional art, the multi-layered memory device according to at least this example embodiment groups a plurality of memory layers and an active circuit unit controlling the plurality of memory layers into a memory group, and a plurality of the memory groups are stacked each other, thus, there is no limit in the number of memory units, which may be stacked.

Referring to FIG. 2B, according to at least this example embodiment, the memory device may include a plurality of memory groups, each including an active circuit and a memory unit. Each memory unit may include a plurality of memory layers. The plurality of memory groups may be stacked on a logic circuit or unit.

In at least this example embodiment, a first memory unit 201 may be formed on a logic unit 200. A first active circuit unit 202 may be formed on the first memory unit 201. The first memory unit 201 and the first active circuit 202 constitute a first memory group. A second memory unit 203 and a second active circuit unit 204 may be formed on the first active circuit unit 202. The second memory unit 203 and the second active circuit 204 constitute a second memory group. A third memory unit 205 and a second active circuit unit 206 may be formed on the second active circuit unit 204. The third memory unit 205 and the third active circuit 206 constitute a third memory group.

In a structure of FIG. 2B, active circuit units 202, 204, and 206 may be formed on memory units 201, 203, and 205, respectively, and a memory group including a memory unit and an active circuit unit may be sequentially stacked on the logic unit 200. The logic unit 200 may include a logic circuit, and may select one or more of the active circuit units 202, 204, and 206. Each of the active circuit units 202, 204, and 206 may include a decoder, and may select one or more of the memory units 201, 203, and 205. The decoder may include a row decoder (RD) and a column decoder (CD).

Figure 2C:
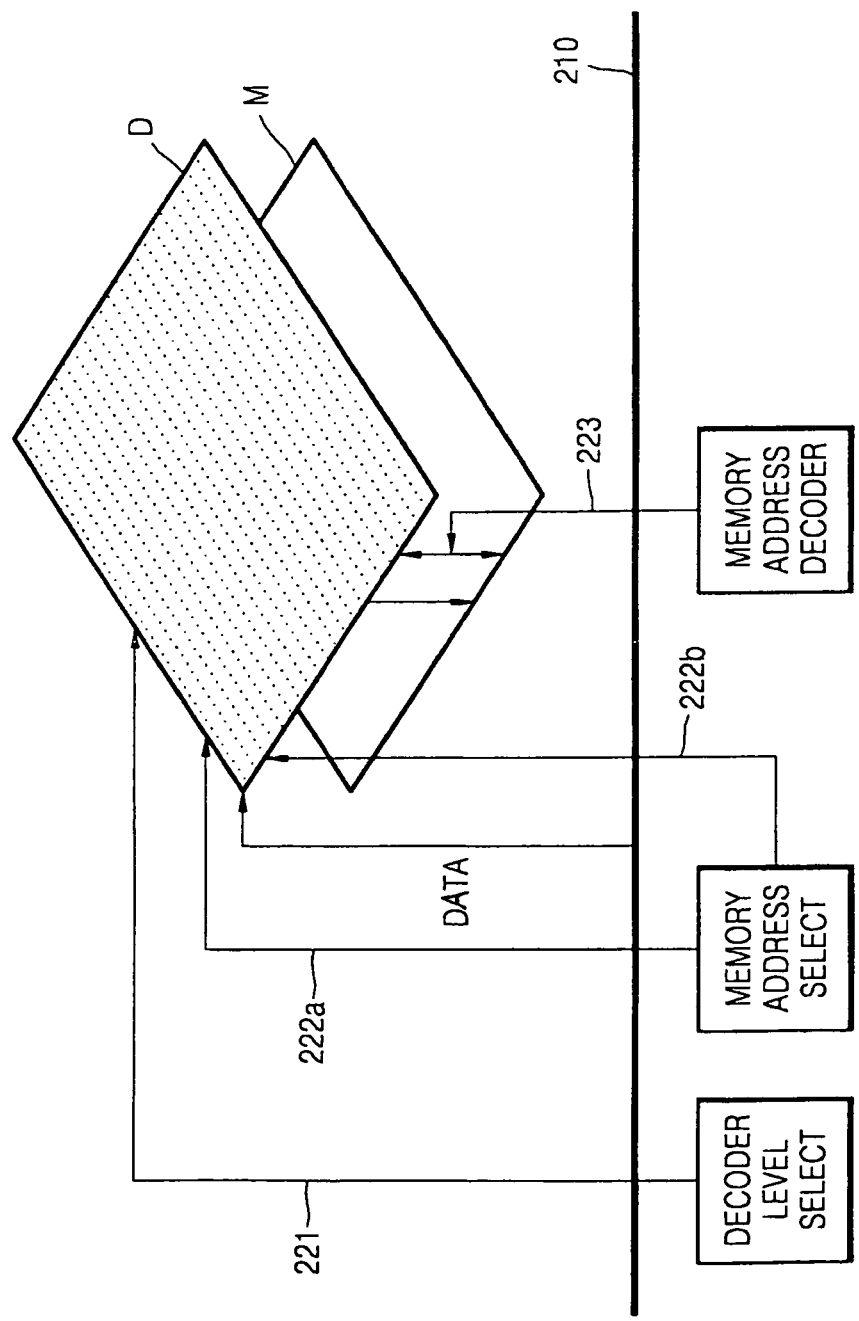
FIGS. 2C and 2D are diagrams for describing example driving principles of multi-layered memory devices according to example embodiments.
Figure 2D:
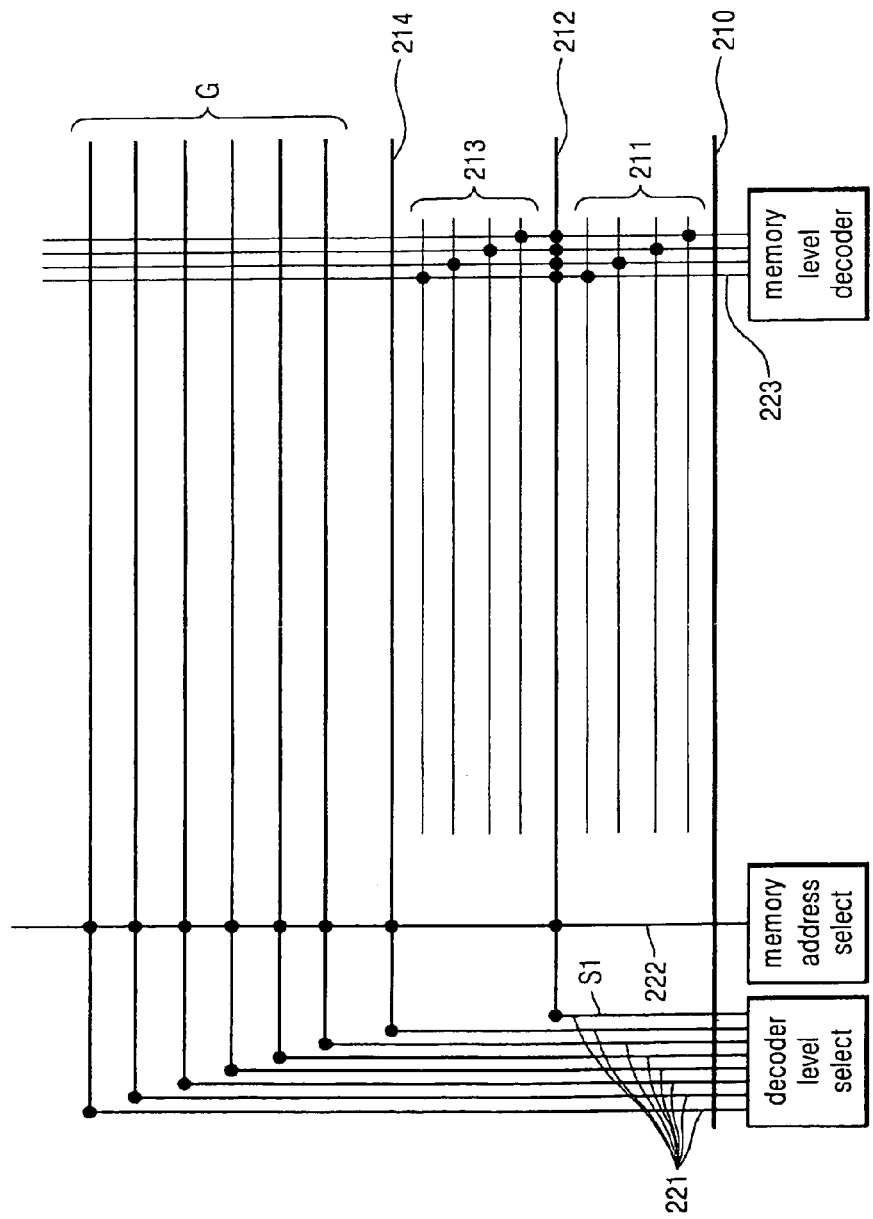

FIGS. 2C and 2D are diagrams for describing a driving principle of a multi-layered memory device according to example embodiments.

Referring to FIG. 2C, the multi-layered memory device according to at least one example embodiment may have a structure in which a plurality of memory units M and a plurality of active circuit units D are formed on a logic unit 210 (e.g., as shown in FIG. 2A or 2B). The logic unit 210 may be connected to the plurality of active circuit units D through decoder selection lines 221, and may select a specific active circuit unit from among the plurality of active circuit units D. An address (a row and a column) of a desired memory cell may be input through a memory address selection line connected to the logic unit 210 and the plurality of active circuit units D. A memory address selection signal may be input through a row line 222a and a column line 222b. A specific memory layer of the plurality of memory units M may be selected through a memory level decoder. This will be described in detail below with reference to FIG. 2D.

Referring to FIG. 2D, a plurality of memory units 211 and 213, and a plurality of active circuit units 212 and 214 may be formed on the logic unit 210. The first active circuit unit 212 may write and read data to and from the first memory unit 211. The second active circuit unit 214 may write and read data to and from the second memory unit 213. When an active circuit unit and a memory unit are grouped into memory groups denoted by G in FIG. 2D, a plurality of (e.g., an unlimited number of) memory groups G may be formed on the second active circuit unit 214.

The logic unit 210 may be connected to each of the active circuit units 212 and 214 through the decoder selection lines 221. The logic unit 210 may select a specific active circuit unit from among the active circuit units 212 and 214, through the decoder selection lines 221. For example, in the case where the first active circuit unit 212 is selected, a selection line s1 may be ON, whereas the rest of the decoder selection lines 221 may be OFF. Subsequently, an address (a row and a column) of a desired memory cell may be input through a memory selection line 222 connected to the logic unit 210 and the plurality of active circuit units 212 and 214. Only the first active circuit unit 212 may be in an ON-state, and thus, only an address of specific memory cells in each of memory layers of the first memory unit 211 may be input. Afterward only a specific memory layer of the first memory unit 211 may be selected through the memory level decoder. As a result, the desired memory cell may be selected.

Figure 3:
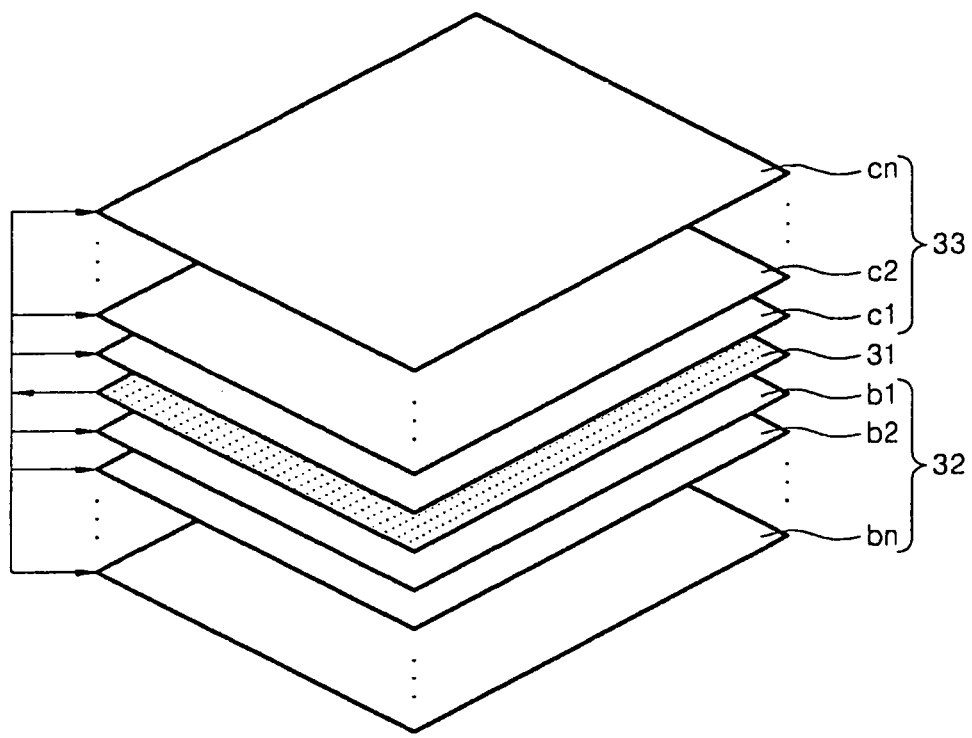
FIG. 3 is a diagram illustrating a multi-layered memory device according to another example embodiment.

FIG. 3 is a diagram illustrating a multi-layered memory device according to another example embodiment. According to at least this example embodiment, a memory unit may be formed on each of a plurality of sides of an active circuit.

Referring to FIG. 3, memory units 32 and 33 may be formed on top and bottom (e.g., both) surfaces of an active circuit unit 31. The first memory unit 32 may include one or more (e.g., a plurality of) memory layers b1 through bn. The second memory unit 33 may include one or more (e.g., a plurality of) memory layers c1 through cn. There is no limit in the number of memory layers capable of being included in the memory units 32 and 33. The active circuit unit 31 may include a decoder capable of selecting one or more memory layers b1 through bn of memory unit 32 and/or one or more of memory layers c1 through cn of memory unit 33. The active circuit 31 may include a sense amplifier, a buffer, a step-down circuit, a boosting circuit, a detecting circuit, and/or a reference voltage circuit.

Figure 4:
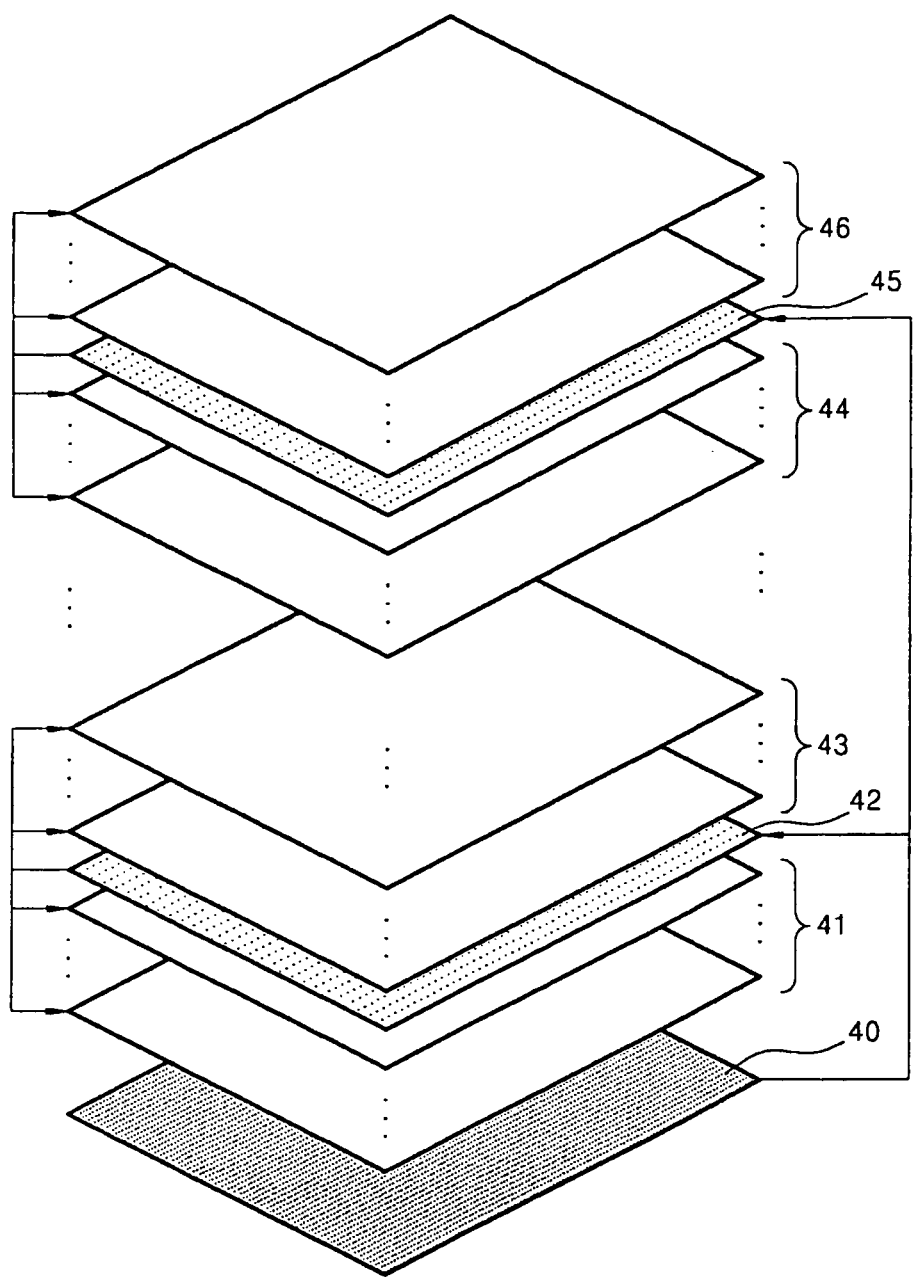
FIG. 4 is a diagram illustrating a multi-layered memory device according to another example embodiment.

FIG. 4 is a diagram illustrating a multi-layered memory device according to another example embodiment. FIG. 4 illustrates a structure in which a plurality of the memory groups, each of which includes an active circuit unit and one or more memory units formed on both (e.g., opposite) surfaces of the active circuit unit, may be stacked on one another.

Referring to FIG. 4, a first memory group may be arranged on a logic circuit 40. The first memory group may include a first active circuit unit 42 and a second memory unit 43 formed on opposite surfaces of a first memory unit 41. A second memory group may be formed above the first memory group. The second memory group may include a third memory unit 44 and a fourth memory unit 45 formed on opposite surfaces of a second active circuit unit 45. The logic unit 40 may include a logic circuit, and may select one or more of the active circuit units 42 and 45. Each of the active circuit units 42 and 45 may include a decoder. The active circuit unit 42 may select one or more of the memory units 41 and 43 formed on surfaces of the active circuit unit 42. The active circuit unit 45 may select one or more of the memory units 44 and 46 formed on surfaces of the active circuit unit 45.

Figure 5:
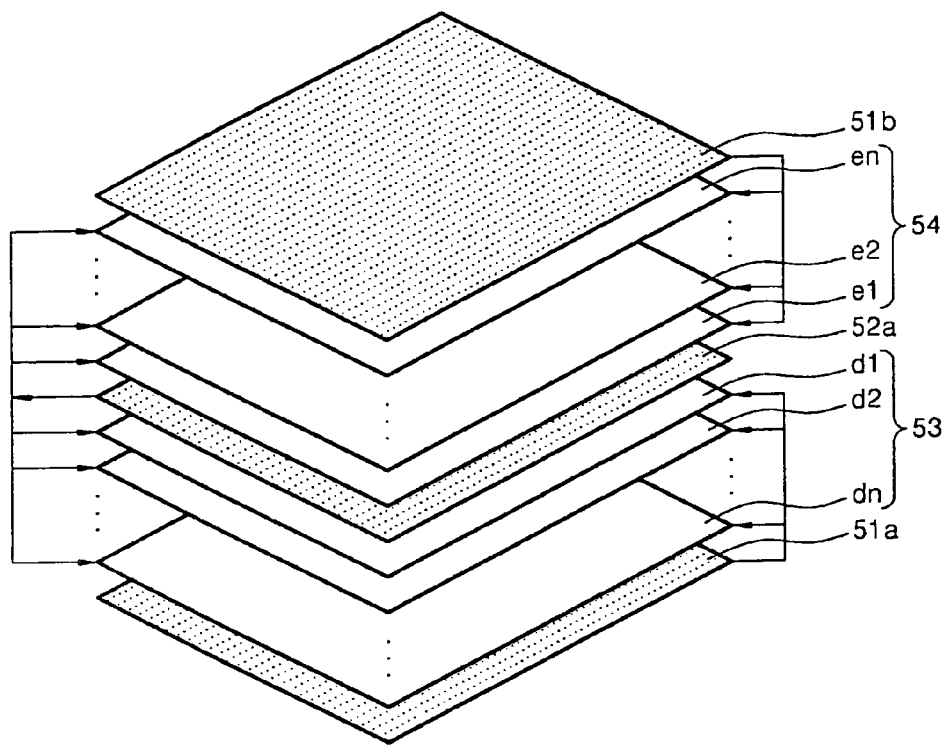
FIG. 5 is a diagram illustrating a multi-layered memory device according to another example embodiment.

FIG. 5 is a diagram illustrating a multi-layered memory device according to another example embodiment. In the multi-layered memory device of FIG. 5, a column decoder (CD) and a row decoder (RD) may be formed on separate layers so as to select a memory unit.

Referring to FIG. 5, a first memory unit 53 may be formed on a first active circuit unit 51a. A second active circuit unit 52a, a second memory unit 54, and a third active circuit unit 51b may be formed on the first memory unit 53. The first active circuit unit 51a and the third active circuit unit 51b may include one of the CD and the RD. If the first active circuit unit 51a and the third active circuit unit 51b include the CD, the second active circuit unit 52a may include the RD. Alternatively, if the first and third active circuit units 51a and 51b include the RD, then the second active circuit 52a may include the CD.

The first memory unit 53 may include one or more memory layers d1 through dn, and the second memory unit 54 may include one or more memory layers e1 through en. There is no limit in the number of memory layers capable of being formed on the active circuit units. Each of the active circuit units 51a, 52a, and 51b may be connected to one or more of the first and second memory units 53 and 54 in upper and lower directions so as to select the one or more memory layers d1 through dn of the first memory unit 53 or the one or more memory layers e1 through en of the second memory unit 54. For example, if the first active circuit unit 51a includes the CD and the second active circuit unit 52a includes the RD, the first and second active circuit units 51a and 52a may be used to select the one or more memory layers d1 through dn of the first memory unit 53. Similarly, if the third active circuit unit 51b includes the CD and the second active circuit unit 52a includes the RD, the second and third active circuit units 52a and 51b may be used to select the one or more memory layers e1 through en of the second memory unit 53

Figure 6:
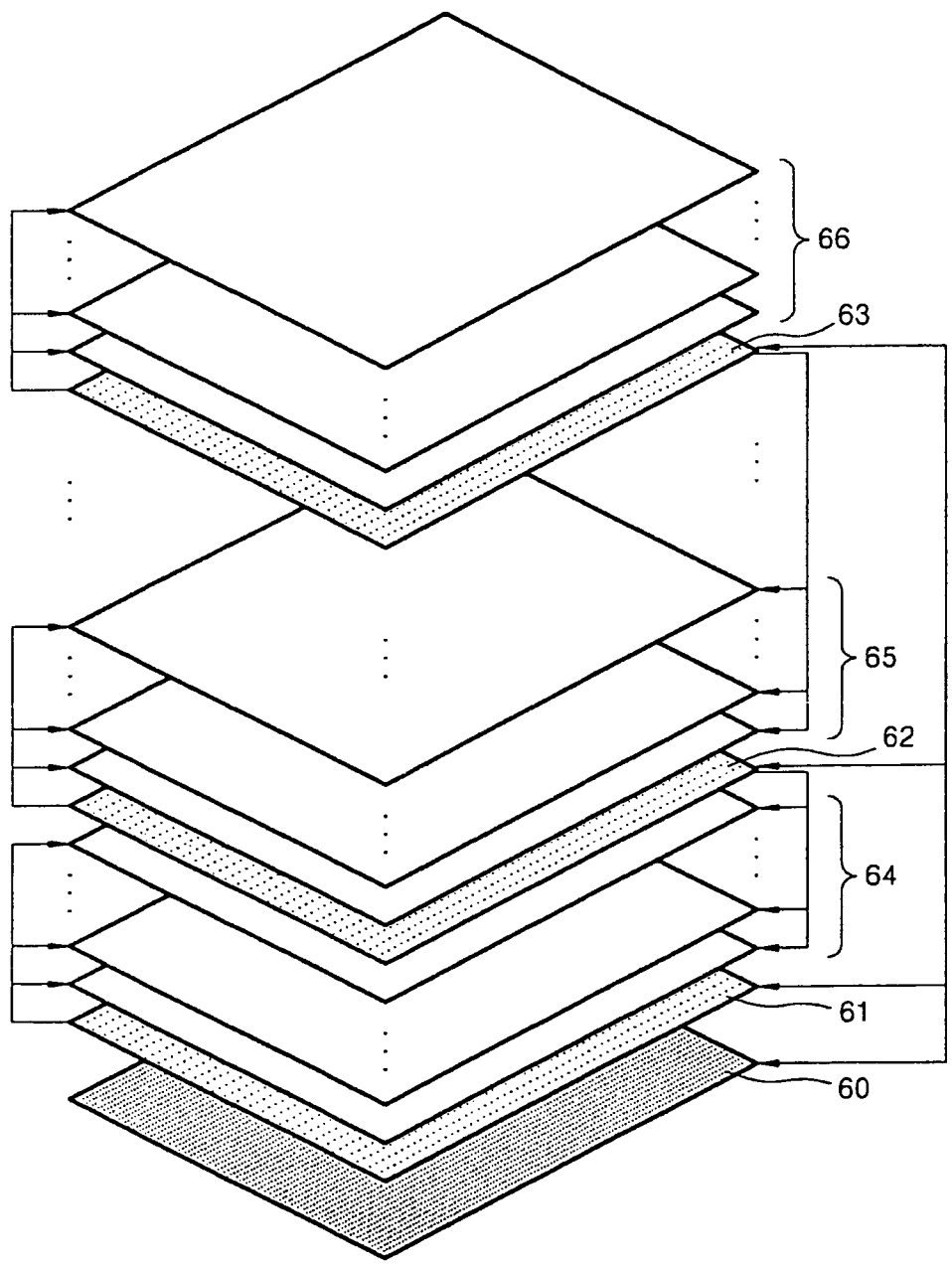
FIG. 6 is a diagram illustrating a multi-layered memory device according to another example embodiment.

FIG. 6 is a diagram illustrating a multi-layered memory device according to another example embodiment.

Referring to FIG. 6, a first active circuit unit 61 and a first memory unit 64 may be formed on a logic unit 60. A second active circuit unit 62 and a second memory unit 65 may be formed on the first memory unit 64. A third active circuit unit 63 and a third memory unit 66 may be formed above the second memory unit 65. The logic unit 60 may include a logic circuit, and may select one or more of the active circuit units 61, 62, and 63. Each of the active circuit units 61, 62, and 63 may include one of a CD and a RD, and may respectively select one or more of the memory units 64, 65, and 66. According to at least this example embodiment, the first memory unit 64 may be formed on a second surface of the active circuit unit 61 and on a first surface of the second active circuit 62. The second memory unit 65 may be formed on a second surface of the second active circuit unit 62 and a first surface of the third active circuit unit 63. The third memory unit 66 may be formed on a second surface of the third active circuit unit 63. By sequentially forming an active circuit unit including the CD or the RD and a memory unit on the logic unit 60, a stacked structure may be formed.

Alternatively, each of the active circuit units 61, 62, and 63 may include both the CD and the RD. In at least this example embodiment, the CD of the first active circuit unit 61 and the RD of the second active circuit unit 62 may be used to address the first memory unit 64. The CD of the second active circuit unit 62 and the RD of the third active circuit unit 63 may be used to address the second memory unit 65.

Alternatively, the RD of the first active circuit unit 61 and the CD of the second active circuit unit 62 may be used to address the first memory unit 64, and the RD of the second active circuit unit 62 and the CD of the third active circuit unit 63 may be used to address the second memory unit 65.

As described above, memory layers of the multi-layered memory device according to at least some example embodiments may be formed as a cross-point type memory array. For example, a plurality of lower electrode lines and a plurality of upper electrode lines crossing the plurality of lower electrode lines may be formed in each of the memory layers, and a switch structure and an electric charge storage structure may be sequentially formed in an area where the plurality of lower and upper electrode lines cross each other. The plurality of lower electrode lines and the plurality of upper electrode lines may be individually connected to the RD or the CD of the active circuit unit.

Each of the memory layers may include a memory array, and unlike the conventional technology, may not include a separate memory array enable circuit. In multi-layered memory devices according to at least some example embodiments, the logic unit 60 may be formed on a silicon substrate or a non-silicon substrate. For example, after the logic circuit forming the logic unit 60 is formed on one of the silicon substrate and the non-silicon substrate, an interlayer dielectrics (ILD) process may be performed. The memory unit and the active circuit unit may then be formed repeatedly on the logic unit 60. Examples of the non-silicon substrate are a plastic substrate, a glass substrate, a ceramic substrate, an oxide substrate, or a nitride substrate. The active circuit unit may include a decoder, and optionally, a sense amplifier, a buffer, a step-down circuit, a boosting circuit, a detecting circuit, and/or a reference voltage circuit. Conventionally, the active circuit unit is formed on the silicon substrate such that an area is limited, a processable memory cell area is also limited, and the number of stackable memory layers is limited. However, according to example embodiments, the active circuit unit may be formed between each of memory units so that such limits may be overcome.

Figure 7A:
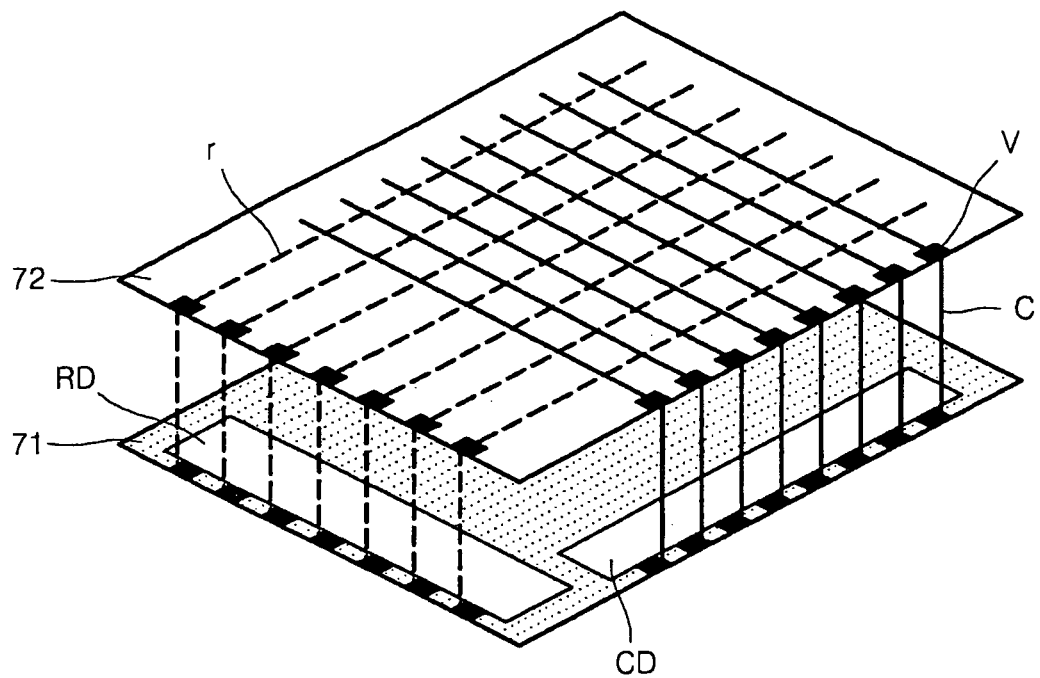
FIGS. 7A and 7B are diagrams illustrating an array structure of a decoder circuit that is a part of an active circuit unit in a structure in which a memory unit is formed on a surface of the active circuit unit of a multi-layered memory device according to example embodiments.
Figure 7B:
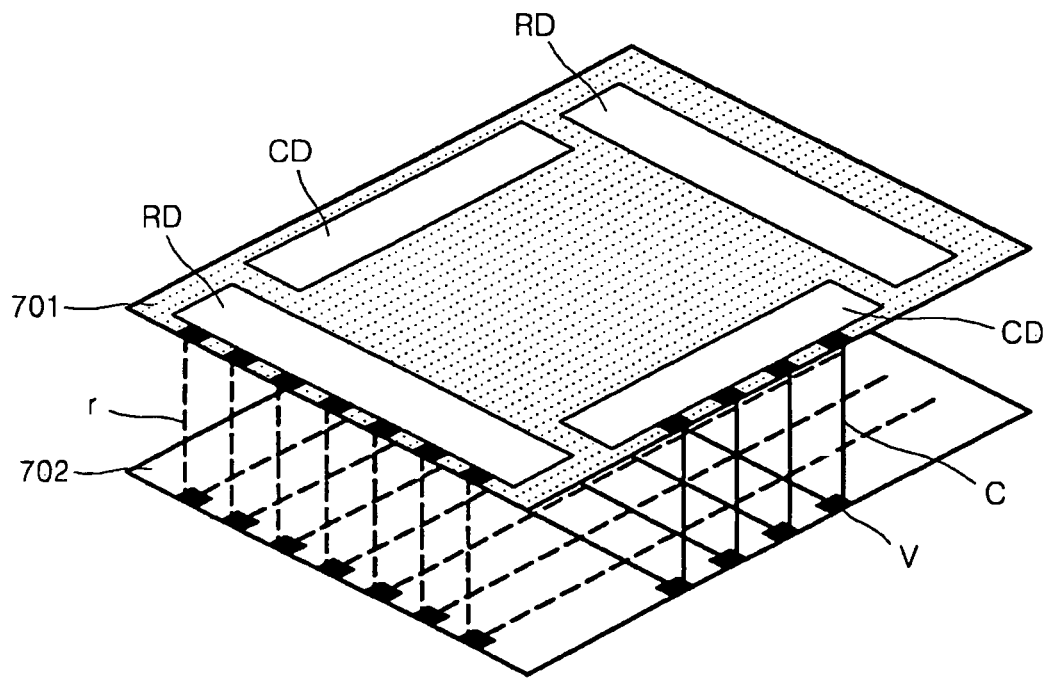

FIGS. 7A and 7B are diagrams illustrating an array structure of a decoder circuit of an active circuit unit in a structure in which a memory unit is formed on one surface of the active circuit unit of a multi-layered memory device according to another example embodiment. Each decoder circuit may include a RD and a CD.

Referring to FIG. 7A, a RD and a CD may be formed on an active circuit unit 71. Row address lines r extending upward from the RD connect the active circuit unit 71 to a memory unit 72 arranged above the active circuit unit 71 through vias V. Column address lines c extending upward from the CD also connect the active circuit unit 71 to the memory unit 72 through vias V. If the memory unit 72 includes one or more memory layers, the row address lines r and the column address lines c may be connected to each of the one or more memory layers.

Referring to FIG. 7B, an active circuit unit 701 may include a RD and a CD. Row address lines r extending downward from the RD connect the active circuit unit 701 to a memory unit 702 arranged below the active circuit unit 701 through vias V. Column address lines c extending downward from the CD also connect the active circuit unit 701 to the memory unit 702 through vias V. If the memory unit 702 includes one or more memory layers, the row address lines r and the column address lines c may be connected to each of the one or more memory layers.

In a structure in which the RD and the CD are formed on the active circuit unit 701, and memory units (each of which includes a plurality of memory layers) are formed on both top and bottom surfaces of the active circuit unit 701, the row address lines r and the column address lines c may be connected to each of the plurality of memory layers.

Figure 8A:
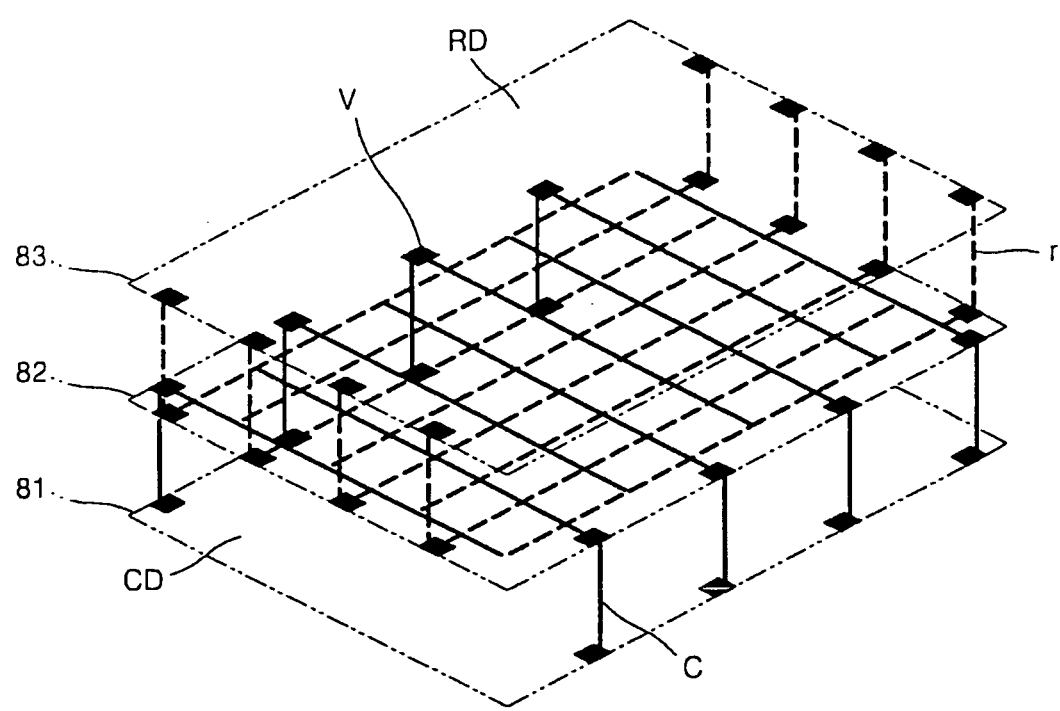
FIGS. 8A and 8B are diagrams illustrating a structure of a multi-layered memory device in which one of a row decoder (RD) circuit and a column decoder (CD) circuit is formed below a memory unit and the other one of the RD circuit and the CD circuit is formed above the memory unit, such that information of the memory unit is recorded in and read from the multi-layered memory device according to example embodiments.
Figure 8B:
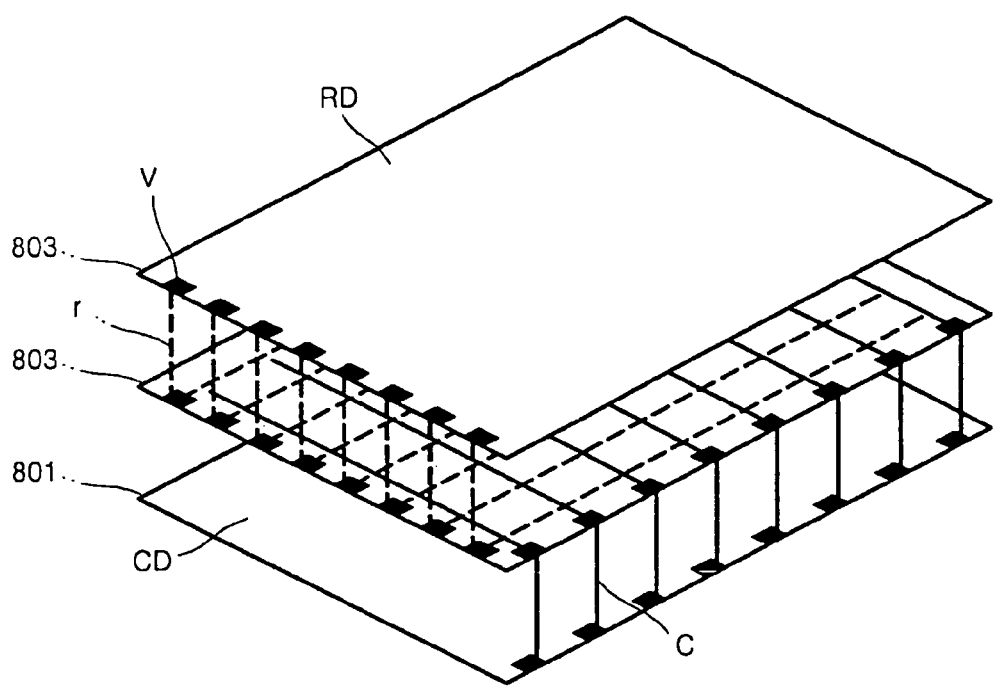

FIGS. 8A and 8B are diagrams illustrating a structure of a multi-layered memory device in which one of a RD circuit and a CD circuit is formed below a memory unit, and the other one of the RD circuit and the CD circuit is formed above the memory unit, such that information is recorded in and read from multi-layered memory devices according to example embodiments.

Referring to FIG. 8A, a memory unit 82 and a second active circuit unit 83 may be sequentially formed on a first active circuit unit 81. A CD may be formed on the first active circuit unit 81, and a RD may be formed on the second active circuit unit 83. Column address lines c extending upward from the CD of the first active circuit unit 81 may be connected to the memory unit 82 through vias V. As shown in FIG. 8A, the CD of the first active circuit unit 81 may be connected to memory unit 82 in an alternating manner such that adjacent columns of the memory array are connected to different sides of the CD. For example, a first of two adjacent columns may be connected to a via V at a first side of the first active circuit unit 81, whereas a second of two adjacent columns of the memory unit 82 may be connected to a second, opposite side of the CD. Row address lines r extending downward from the RD of the second active circuit unit 83 may be connected to the memory unit 82 through vias V. As shown in FIG. 8A, the RD of the second active circuit unit 83 may be connected to memory unit 82 in an alternating manner such that adjacent rows of the memory array are connected to different sides of the RD. For example, a first of two adjacent rows may be connected to a via V at a first side of the second active circuit unit 83, whereas a second of two adjacent rows of the memory unit 82 may be connected to a second, opposite side of the second active circuit unit 83. The first and second side to which the row address lines r are connected may be different from the first and second sides that the column address lines c are connected.

If the memory unit 82 is formed to have a plurality of memory layers, the row address lines r and the column address lines c may be connected to each of the plurality of memory layers.

In FIG. 8B, column address lines c extending upward from a CD of a first active circuit unit 801 may be connected to a memory unit 802 through vias V on only one side end of the first active circuit unit 801. Row address lines r extending from a RD of a second active circuit unit 803 may be connected to the memory unit 802 through vias V at only a front end of the second active circuit unit 803. If the memory unit 802 includes a plurality of memory layers, the row address lines r and the column address lines c may be connected to each of the plurality of memory layers.

Figure 9A:
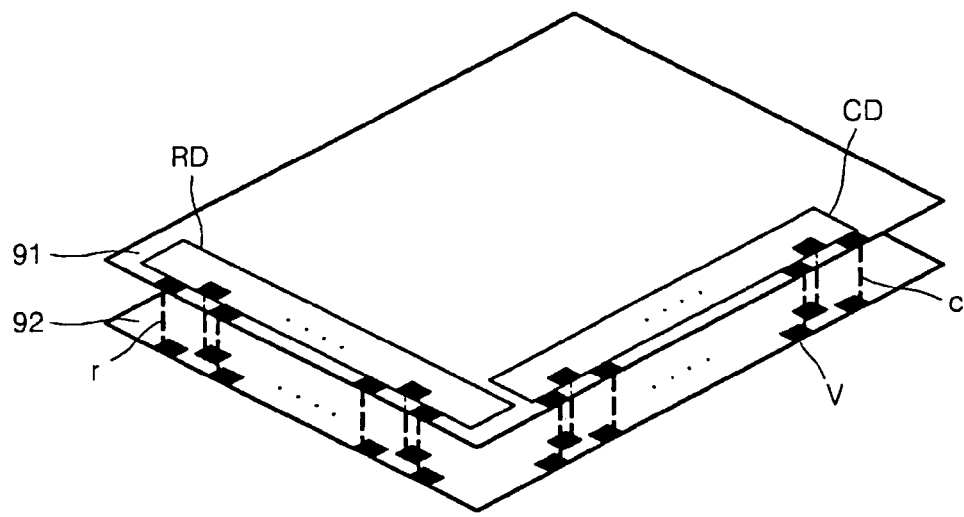
FIGS. 9A and 9B are diagrams illustrating a structure of a multi-layered memory device in which vias v are formed alternately to increase density of address lines diverging from a CD and a RD in the multi-layered memory device according to example embodiments.
Figure 9B:
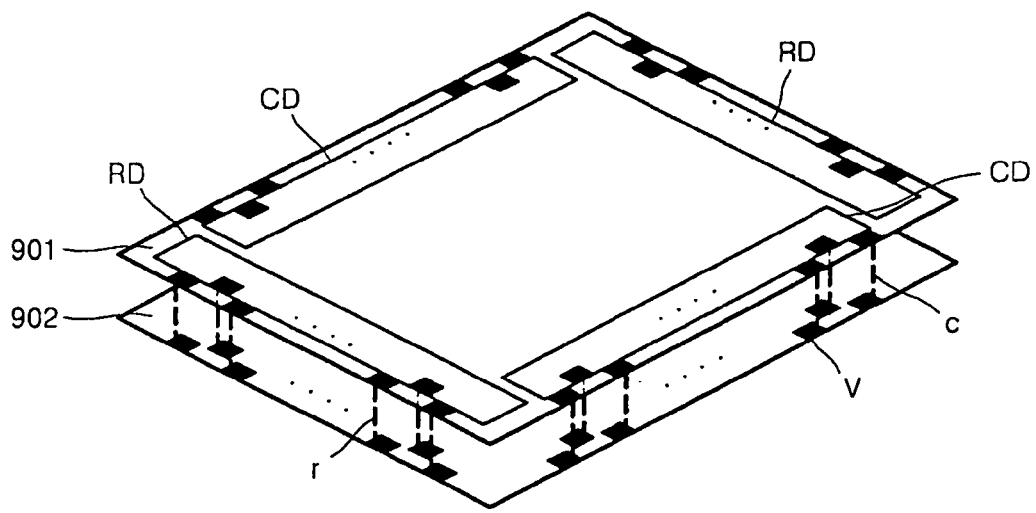

FIGS. 9A and 9B are diagrams illustrating a structure of a multi-layered memory device in which vias V are formed alternately to increase density of address lines extending from a CD and a RD in the multi-layered memory device according to another example embodiment.

Referring to FIG. 9A, a RD and a CD may be formed on ends of respective first and second sides of an active circuit unit 91. A memory unit 92 may be formed below the active circuit unit 91. Row address lines r and column address lines c extending from the RD and the CD, respectively, of the active circuit unit 91, may be connected to the memory unit 92 through vias V. The vias V may be formed alternately offset from one another in a given direction. For example, the vias V connected to the row address lines r may be offset from one another in a direction that is perpendicular to a direction in which the first side of the active circuit unit 91 extends. Similarly, the vias V connected to the column address lines c may be offset from one another in a direction that is perpendicular to a direction in which the second side of the active circuit unit 91 extends.

Referring to FIG. 9B, an active circuit unit 901 may include a RD and a CD. In this example embodiment, a CD may be formed on ends of first and second sides of the active circuit unit 901, and the RD may be formed on ends of third and fourth sides of the active circuit unit 901. The first and second sides may be opposite to one another, and the third and fourth sides may be opposite to one another. A memory unit 902 may be formed below the active circuit unit 901. Row address lines r and column address lines c extending from the RD and the CD, respectively, of the active circuit unit 901, may be connected to the memory unit 902 through vias V. The vias V may be formed alternately offset from one another in a given direction. For example, the vias V connected to the row address lines r may be offset from one another in a direction that is perpendicular to a direction in which the first and second sides of the active circuit unit 901 extends. Similarly, the vias V connected to the column address lines c may be offset from one another in a direction that is perpendicular to a direction in which the third and fourth sides of the active circuit unit 901 extends.

The position and shape of vias Via V may be selectively determined according to configuration and/or density of an array device of the memory units 92 and 902, but example embodiments are not limited thereto. The active circuit unit and the memory unit illustrated in each of FIGS. 7A through 9B may be grouped into a memory group, and the memory group may be stacked repeatedly. Thus, connection lines may be simplified to reduce the number of vias as compared to a conventional memory device using only a single active circuit unit.

Figure 10:
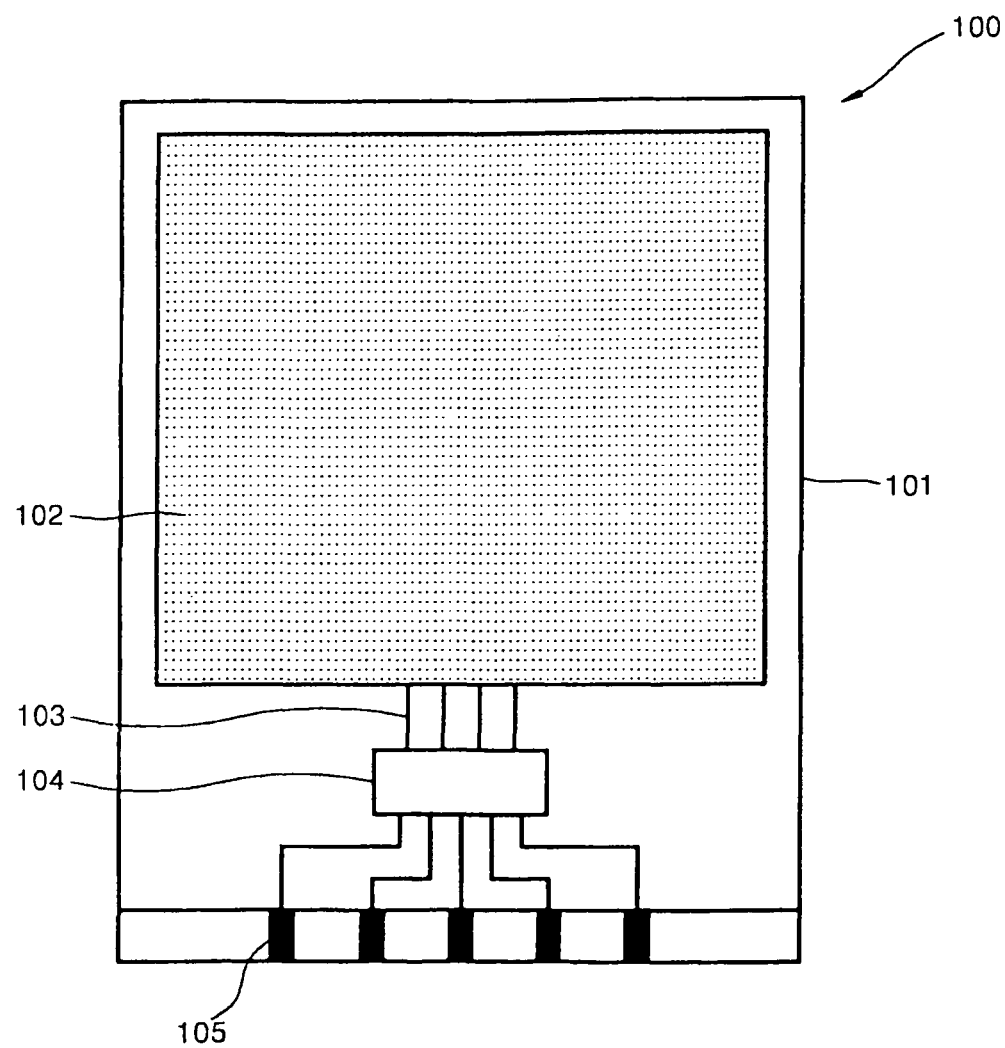
FIG. 10 is a diagram illustrating a multi-layered memory device according to example embodiments.

FIG. 10 is a diagram illustrating a multi-layered memory device according to another example embodiment.

Referring to FIG. 10, the multi-layered memory device 100 may include a memory area 102 formed on a substrate 101, an input/output (I/O) chip 104, a parallel bus line 103 connecting the memory area 102 and the I/O chip 104, and a serial bus line 105 connecting the I/O chip 104 and a master device or module (not shown). The memory area 102 may have a multi-layered structure, for example, as discussed above.

According to example embodiments, various electronic elements may be manufactured given the knowledge of one of ordinary skill in the art. Multi-layered memory devices according to example embodiments may be used as, for example, media devices for various products, such as, mobile or cellular phones, smart phones, personal digital assistants (PDAs), laptop or desktop computers, digital cameras, digital camcorders, MP3 or other portable music player, etc.

While example embodiments have been particularly shown and described with reference to the example embodiments shown in the drawings, it will be understood by those of ordinary skill in the art that various changes in form and details may be made therein without departing from the spirit and scope of the present invention as defined by the following claims.

What is claimed is:

1. A multi-layered memory device, comprising:
   a plurality of memory groups stacked on each other, each memory group including,
   a memory unit, and
   an active circuit unit configured to control the memory unit, wherein
   the active circuit unit includes at least one of a column decoder and a row decoder,
   the column decoder includes a first column decoder circuit at a first side of the active circuit unit and a second column decoder circuit at a second side of the active circuit unit,
   the first and second sides of the active circuit unit are opposite each other,
   the row decoder includes a first row decoder circuit at a third side of the active circuit unit and a second row decoder circuit at a fourth side of the active circuit unit, and
   the third and fourth sides of the active circuit unit are opposite to each other.

2. The multi-layered memory device of claim 1, wherein the memory unit includes one or more memory layers.

3. The multi-layered memory device of claim 2, wherein the one or more memory layers are a cross-point type memory array.

4. The multi-layered memory device of claim 3, wherein a plurality of sub-arrays are formed on the one or more memory layers.

5. The multi-layered memory device of claim 3, wherein the cross-point type memory array has a structure in which adjacent memory layers share electrodes.

6. The multi-layered memory device of claim 1, wherein the active circuit unit is formed on a non-silicon substrate.

7. The multi-layered memory device of claim 1, wherein column address lines connect the column decoder to the memory unit through vias, and row address lines connect the row decoder to the memory unit through vias.

8. A multi-layered memory device, comprising:
   a plurality of memory groups stacked on each other, each memory group including,
   a memory unit, and an active circuit unit configured to control the memory unit, wherein
the active circuit unit includes a first active circuit unit having a column decoder and a second active circuit unit having a row decoder, the memory unit being connected to each of the first active circuit unit and the second active circuit unit,
the column decoder includes a first column decoder circuit at a first side of the active circuit unit and a second column decoder circuit at a second side of the active circuit unit,
the first and second sides of the active circuit unit are opposite each other
the row decoder includes a first row decoder circuit at a third side of the active circuit unit and a second row decoder circuit at a fourth side of the active circuit unit, and
the third and fourth sides of the active circuit unit are opposite to each other.

9. The multi-layered memory device of claim 8, wherein column address lines connect the column decoder of the first active circuit unit to the memory unit through vias, and row address lines connect the row decoder of the second active circuit unit to the memory layers through vias.

10. The multi-layered memory device of claim 1, further including,
a logic unit formed on a surface of one of the active circuit unit and the memory unit.

11. The multi-layered memory device of claim 1, further comprising:
column address lines;
row address lines; and
vias, wherein
the active circuit includes the column decoder and the row decoder,
the column address lines connect the first column decoder circuit and the second column decoder circuit to the memory unit through some of the vias, and
the row address lines connect the first row decoder circuit and the second row decoder circuit to the memory unit through others of the vias.

12. The multi-layered memory device of claim 11, wherein a portion of the vias connected to the column address lines are offset from an other portion of the vias connected to the column address lines in a direction that is perpendicular to a direction that the first and second sides of the active circuit extend, and
a portion of the vias connected to the row address lines are offset from an other portion of the vias connected to the row address lines in a direction that is perpendicular to a direction that the third and fourth sides of the active circuit extend.

13. The multi-layered memory device of claim 1, wherein the active circuit unit is on the memory unit.

14. The multi-layered memory device of claim 8, further comprising:
column address lines;
row address lines; and
vias, wherein
column address lines connect the first column decoder circuit and the second column decoder circuit of the column decoder to the memory unit through some vias, and
row address lines connect the first row decoder circuit and the second row decoder circuit of the row decoder to the memory layers through other vias.

15. The multi-layered memory device of claim 14, wherein a portion of the vias connected to the column address lines are offset from an other portion of the vias connected to the column address lines in a direction that is perpendicular to a direction that the first and second sides of the active circuit extend, and
a portion of the vias connected to the row address lines are offset from an other portion of the vias connected to the row address lines in a direction that is perpendicular to a direction that the third and fourth sides of the active circuit extend.

16. The multi-layered memory device of claim 8, wherein the memory unit includes one or more memory layers, and the one or more memory layers are a cross-point type memory array.

17. The multi-layered memory device of claim 16, wherein a plurality of sub-arrays are formed on the one or more memory layers.

18. The multi-layered memory device of claim 17, wherein the cross-point type memory array has a structure in which adjacent memory layers share electrodes.

19. The multi-layered memory device of claim 9, wherein the active circuit unit is on the memory unit.

* * * * *